United States Patent
Cairns et al.

(10) Patent No.: US 6,359,491 B1
(45) Date of Patent: Mar. 19, 2002

(54) VOLTAGE LEVEL SHIFTER AND POLY-SILICON DISPLAY

(75) Inventors: Graham Andrew Cairns; Michael James Brownlow, both of Oxford (GB); Yasushi Kubota, Sakurai; Hajime Washio, Tenri, both of (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/567,757

(22) Filed: May 10, 2000

(30) Foreign Application Priority Data

May 12, 1999 (GB) .............................................. 9910882

(51) Int. Cl.[7] .................................................. H03L 5/00
(52) U.S. Cl. .......................... 327/333; 326/63; 326/81
(58) Field of Search ................................ 327/333, 328; 326/63, 80, 81

(56) References Cited

U.S. PATENT DOCUMENTS

| | | | | |
|---|---|---|---|---|
| 4,558,237 A | * | 12/1985 | Rabe et al. .................... | 326/71 |
| 4,808,825 A | * | 2/1989 | Kousaka et al. ............... | 327/71 |
| 5,463,240 A | * | 10/1995 | Watanbe ....................... | 326/63 |
| 5,491,430 A | * | 2/1996 | Makino et al. ................ | 326/81 |
| 5,880,617 A | * | 3/1999 | Tanaka et al. ............... | 327/333 |
| 5,952,848 A | * | 9/1999 | Morris .......................... | 326/81 |
| 6,166,726 A | * | 12/2000 | Uchida et al. ............... | 345/211 |

FOREIGN PATENT DOCUMENTS

EP          0541242 A1     5/1993

* cited by examiner

*Primary Examiner*—Terry D. Cunningham
(74) *Attorney, Agent, or Firm*—David G. Conlin; William J. Daley, Jr.; Dike, Bronstein, Roberts & Cushman (57) ABSTRACT

A voltage level shifter comprises complementary transistors T1, T2 connected between a supply line vdd and an inverting input !IN. The gates of the transistors T1 and T2 receive a shifted version of the direct input signal IN from a source-follower comprising the transistors T3 and T4.

29 Claims, 11 Drawing Sheets

VOLTAGE LEVEL SHIFTER AND POLY-SILICON DISPLAY

BACKGROUND OF THE INVENTION

1. Field of the Invention

The present invention relates to a voltage level shifter. Such a shifter may, for example, be used in large area silicon-on-insulator (SOI) circuits for interfacing with signals of smaller amplitudes. An example of such an application is monolithic driver circuitry for flat-panel matrix displays, such as liquid crystal displays, fabricated with low temperature poly-silicon thin-film transistors (TFTs) where interfacing between signal levels of 3.3 to 5 volts and signals of 10 to 20 volts is often required. The present invention also relates to a poly-silicon display.

2. Description of the Related Art

Figure 1:
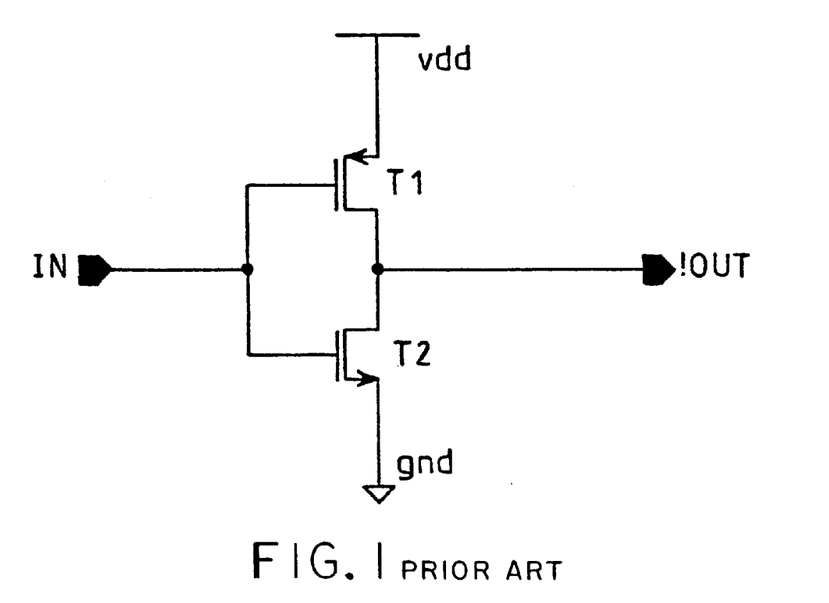
FIG. 1 is a circuit diagram of a known type of CMOS inverter.

FIG. 1 of the accompanying drawings illustrates a basic CMOS inverter which may be used as a simple voltage level shifter. The inverter comprises a P-type transistor T1 and an N-type transistor T2 whose drains are connected together and whose sources are connected to a supply line vdd and ground gnd, respectively. The gates of the transistors T1 and T2 are connected together and to an input terminal IN and the drains of the transistors T1 and T2 are connected together to an inverting output !OUT. The input signals can swing about the inverter switch point between logic levels which are less than the voltages defined by the supply line vdd and ground gnd. The inverter can operate as a level shifter because the output swings between voltage levels which are almost equal to the voltages of the supply line vdd and ground gnd. However, in practice, the degree of level shifting is relatively small because voltages close to the inverter switch point result in simultaneous and undesirable (above threshold) conduction of the transistors T1 and T2. The condition for this not to occur is that:

$$|\Delta V_{IN}| > VDD - V_{Tn} - |V_{Tp}|$$

where VDD is the voltage on the supply line vdd and $V_{Tn}$ and $V_{Tp}$ are the threshold voltages of the N-type and P-type transistors, respectively.

Figure 2:
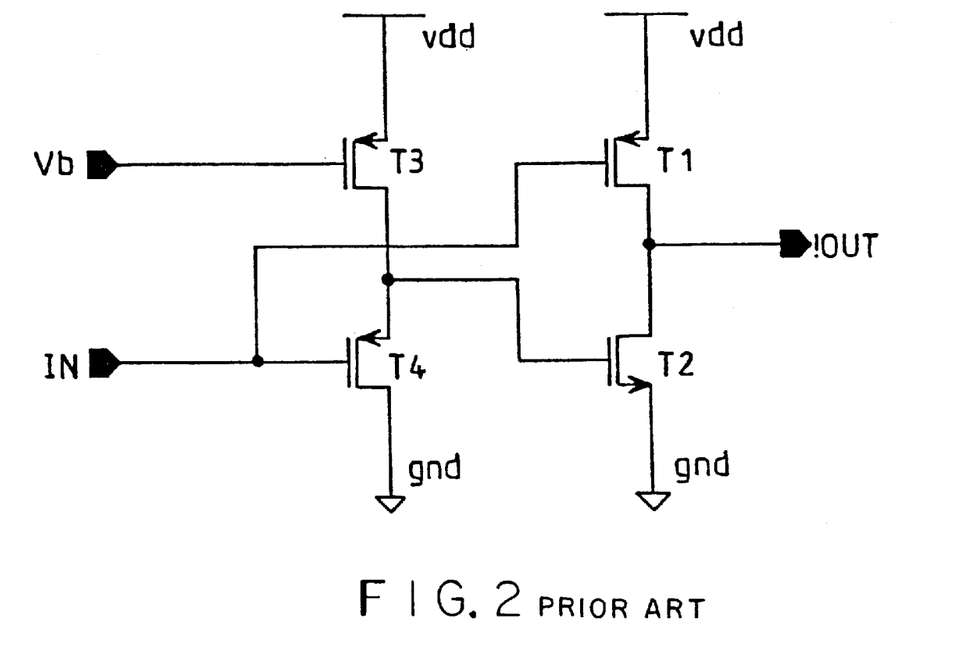
FIG. 2 is a circuit diagram of a known type of level shifter.

FIG. 2 of the accompanying drawings illustrates another type of single input level shifter for low input voltages, for example as disclosed in U.S. Pat. No. 4,707,623. The shifter comprises a first circuit branch comprising a first P-type transistor T1 and a second N-type transistor T2 with their drains connected together to an inverting output !OUT and their sources connected to a supply line vdd and ground gnd, respectively. The level shifter comprises a second circuit branch comprising third and fourth P-type transistors T3 and T4. The source of the third transistor T3 is connected to the supply line vdd whereas the drain of the fourth transistor T4 is connected to ground gnd. The drain of the transistor T3 is connected to the source of the transistor T4 and to the gate of the transistor T2. An input IN is connected to the gates of the transistors T1 and T4. A bias voltage input Vb is connected to the gate of the transistor T3.

The transistors T3 and T4 are connected as a source follower whose output voltage is approximately given by $V_{IN}+(VDD-Vb)$ when the transistors T3 and T4 are matched and are in saturation. The input signal drives the gate of the transistor T1 directly whereas the output of the source follower drives the gate of the transistor T2 with a copy of the input signal which is shifted in the positive direction by (VDD−Vb). These voltage levels are sufficient to switch the transistors T1 and T2, which operate as push-pull devices with high state logic input levels which are substantially lower than the supply voltage and low state logic input levels which are substantially equal to ground potential.

Figure 3:
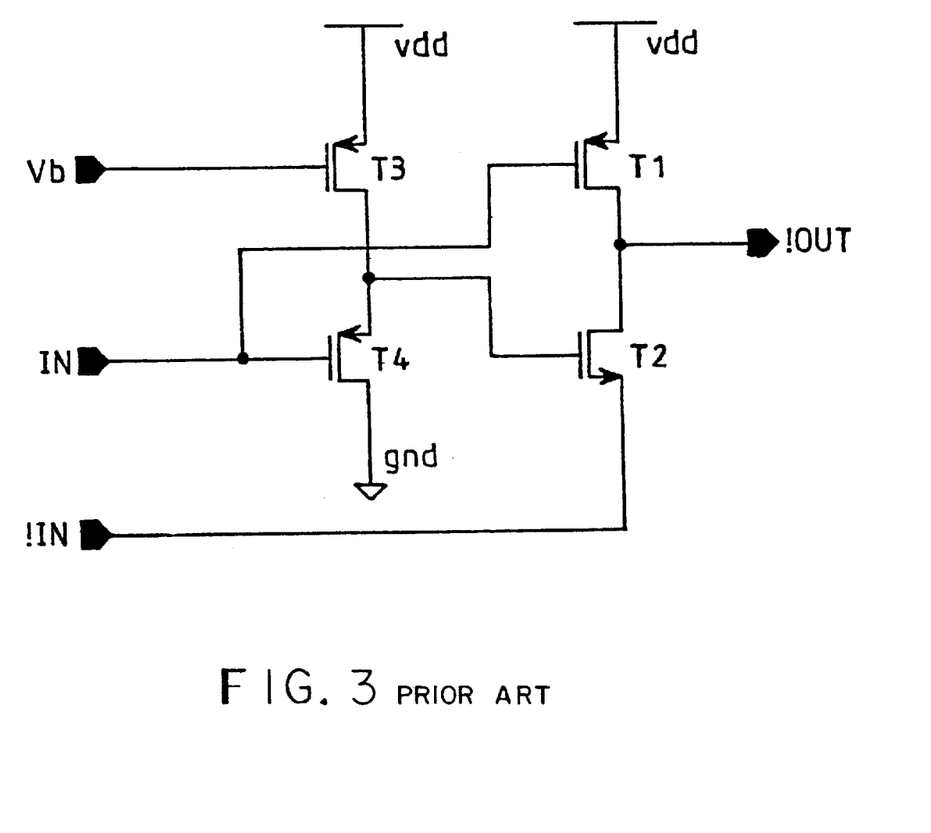
FIG. 3 is a circuit diagram of a level shifter of the type disclosed in GB 9905041.1.

FIG. 3 of the accompanying drawings illustrates a level shifter of the type disclosed in GB 9905041.1. The level shifter illustrated in FIG. 3 is similar to that shown in FIG. 2 and will be described in detail only in so far as it differs therefrom. In particular, the source of the second transistor T2 is connected to a second inverting input !IN which receives an inverted input signal i.e. a signal which is the logical complement of the direct input signals supplied to the input IN.

During operation of the level shifter of FIG. 3, when the input IN is high and the input !IN is low, the level shifter behaves as described hereinbefore for the level shifter of FIG. 2. The output !OUT is thus pulled low. When the input IN goes low and the input !IN goes high, the first transistor T1 is strongly turned on and tries to pull the output !OUT high. The source follower formed by the third and fourth transistors T3 and T4 drives the gate of the transistor T2 with a voltage which is lower than the supply voltage VDD but which is sufficient to turn the transistor T2 on. The high logic input signal at the input !IN is supplied to the source of the transistor T2 and thus reduces the gate-source voltage thereof so that the gate over-drive and pull-down capability at the output !OUT is restricted. Consequently, the output !OUT is pulled up more easily by the action of the first transistor Ti. This results in a larger output swing compared with that produced by the level shifter shown in FIG. 2.

SUMMARY OF THE INVENTION

According to a first aspect of the invention, there is provided a voltage level shifter comprising: a first input for receiving a direct input signal; a second input for receiving an inverted input signal; an output for producing an inverted output signal which is inverted and level-shifted relative to the direct input signal; a voltage follower whose input is connected to the first input; and an output circuit comprising a first transistor of a first conduction type whose output electrode is connected to the output and whose control electrode is connected to an output of the voltage follower, and a second transistor of a second conduction type different from the first type whose output electrode is connected to the output, whose control electrode is connected to the output of the voltage follower, and whose common electrode is connected to the second input.

The voltage follower may comprise third and fourth transistors of the first conduction type whose main conduction paths are connected in series between first and second power supply inputs, the control electrode of the fourth transistor being connected to the first input and the control electrodes of the first and second transistors being connected to the output electrode of the third transistor and to the common electrode of the fourth transistor.

The common electrode of the first transistor may be connected to the first power supply input.

The control electrode of the third transistor may be connected to a bias voltage input. As an alternative, the control electrode of the third transistor may be connected to the second power supply input. As a further alternative, the control electrode of the third transistor may be connected to the second input.

The control electrodes of the first and second transistors may be connected to the output electrode of a fifth transistor of the second conduction type whose common electrode is connected to the second power supply input and whose control electrode is connected to the second input.

The control electrodes of the first and second transistors may be connected to the output electrode of a fifth transistor of the second conduction type whose common electrode is connected to the second power supply input, the control electrodes of the third and fifth transistors being connected to an active low gating input.

The voltage follower input may be connected to the first input via the main conduction path of a sixth transistor of the second conduction type whose control electrode is connected to an active high gating input.

The common electrode of the second transistor may be connected to the second input via the main conduction path of a seventh transistor of the second conduction type whose control electrode is connected to the active high gating input.

The common electrode of the second transistor and the control electrode of the third transistor may be connected to the output electrode of an eighth transistor of the first conduction type whose control electrode is connected to the active high gating input.

Each of the transistors may comprise a field effect transistor and the output, control and common electrodes may comprise drain, gate and source electrodes, respectively. Each of the transistors may comprise an amorphous silicon thin film transistor. As an alternative, each of the transistors may comprise a poly-silicon thin film transistor. The shifter may comprise at least part of a CMOS integrated circuit.

According to a second aspect of the invention, there is provided a poly-silicon display comprising an integrated driver including a shifter according to the first aspect of the invention where each of the transistors comprises a poly-silicon thin film transistor.

It is thus possible to improve the performance of a level shifter. In particular, one or more of the following advantages may be achieved:

(a) greater sensitivity permitting operation with very low input voltages;

(b) more robustness to process variation:

(c) lower power consumption resulting from improved logic level voltages:

(d) guaranteed to work in one polarity if the N-type threshold voltages are low;

(e) can be gated or enabled by a single signal;

(f) can be embodied by transistors of similar size.

BRIEF DESCRIPTION OF THE DRAWINGS

The invention will be further described, by way of example, with reference to the accompanying drawings, in which.

Like reference numerals refer to like parts throughout the drawings.

DESCRIPTION OF THE PREFERRED EMBODIMENTS

Figure 4:
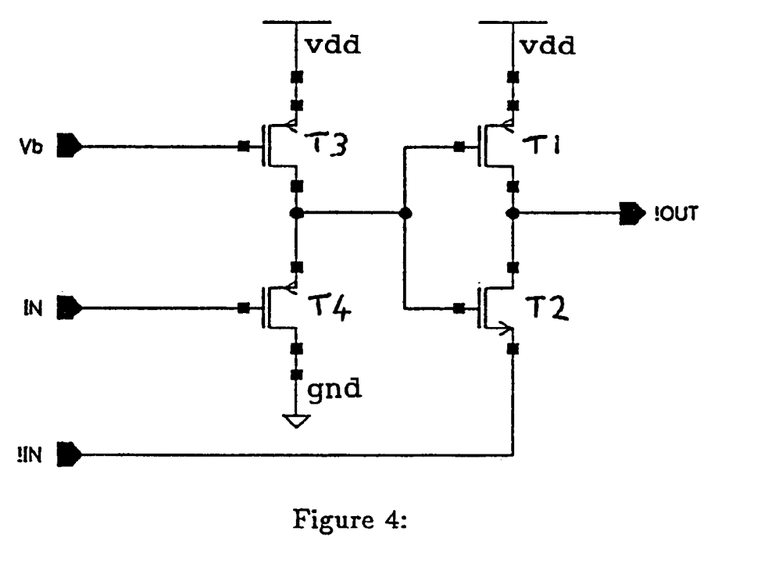
FIG. 4 is a circuit diagram of a level shifter constituting a first embodiment of the invention.

The level shifter illustrated in FIG. 4 is similar to that shown in FIG. 3 and will be described in detail only in so far as it differs therefrom. In particular, the gate of the first transistor T1 is connected to the output of the source follower formed by the third and fourth transistors T3 and T4. The bias voltage input Vb may be connected to ground gnd but, in this case, the fourth transistor T4 has to have more drive than the third transistor T3.

The P-type source follower formed by the transistors T3 and T4 ensure that a shifted version of the logic input signal at the input IN is supplied to the gates of the transistors T1 and T2, which function essentially as an inverter with the source of the second transistor T2 being connected to the input !IN. Provided the shift is not too large, the magnitude of the difference between the logic levels is transferred to the inverter, which responds to the shifted input. This stage is more robust than a conventional type of inverter because, for a relatively low input, the gate-source overdrive of the second transistor T2 is reduced by the connection of its source to the input !IN for receiving the complementary input signal.

Figure 5:
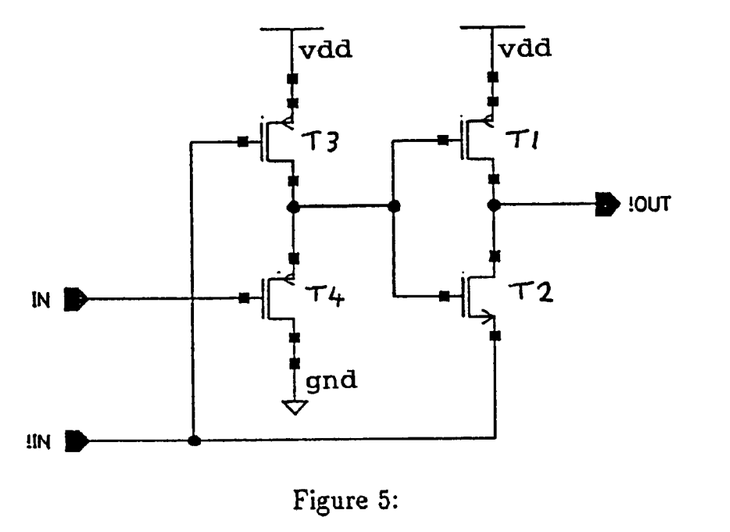
FIG. 5 is a circuit diagram of a level shifter constituting a second embodiment of the invention.

The level shifter shown in FIG. 5 differs from that shown in FIG. 4 in that the gate of the third transistor T3 is connected to the input !IN. This connection increases the voltage swing supplied to the stage comprising the transistors T1 and T2. In particular, when the signal at the input IN is high, the gate of the third transistor T3 is low and the source follower operates with maximum shift so that its output is as high as possible. Alternatively, when the signal at the input IN is low, the bias voltage applied to the transistor T3 is equal to the input signal high level. The source follower thus operates with less boost or, more precisely, less shift in the positive direction so that its output is lower than would otherwise be the case.

Figure 6:
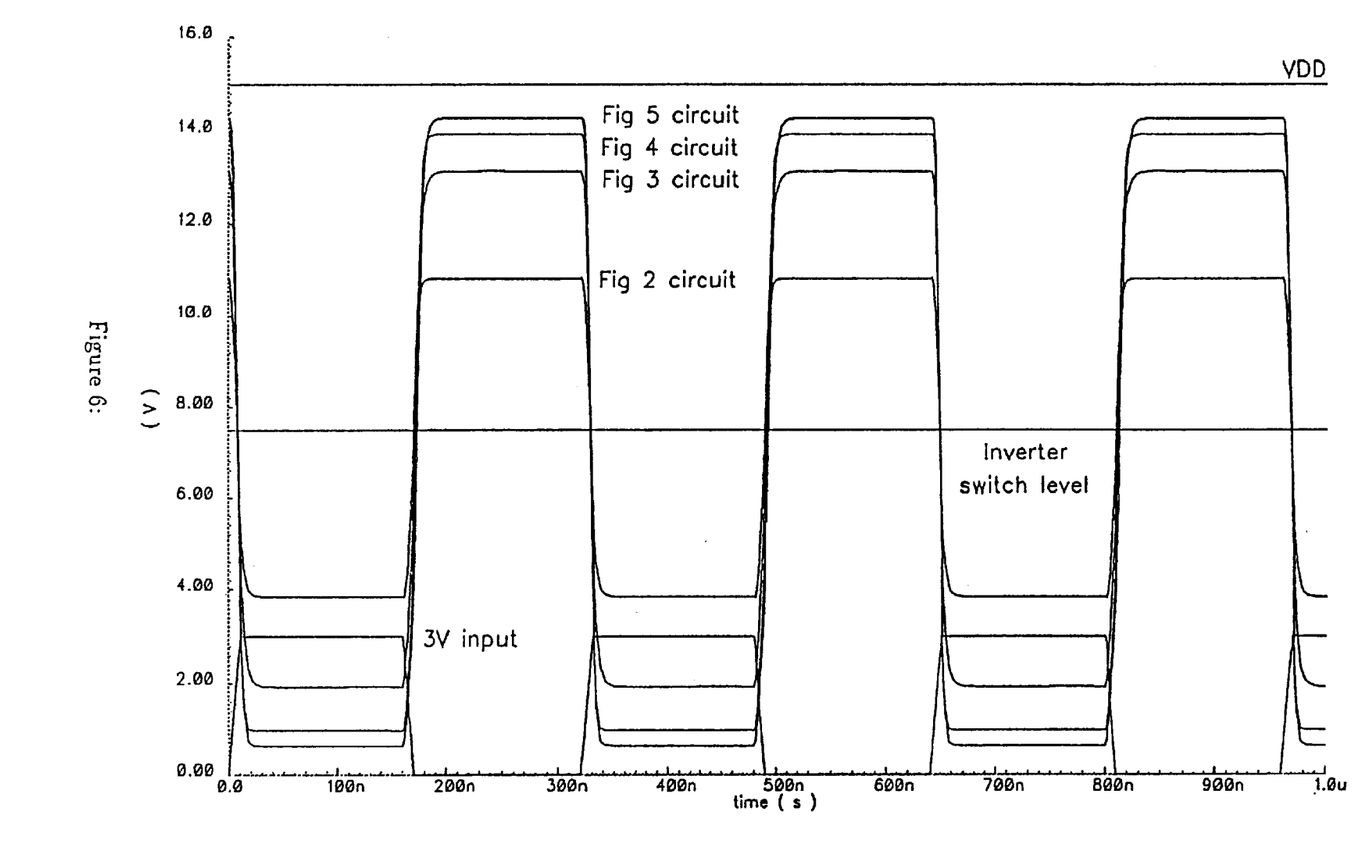
FIG. 6 illustrates waveforms produced by simulations of the level shifters shown in FIGS. 2 to 5.

FIG. 6 shows waveform diagrams resulting from a simulation of the level shifters shown in FIGS. 2 to 5. In particular, this diagram illustrates the output waveforms of these level shifters when responding to the same input signal which is switched between 0 and 3 volts. The supply voltage VDD is 15 volts as shown and the Inverter switch level is approximately 7.5 volts.

For the simulation, all of the transistors had the same gate lengths but had varying gate widths. The P-type source follower of each circuit was identical with the ratio of the gate widths of the transistors T3 and T4 being equal to 1:4. For the transistors T1 and T2, the ratio of the gate width was selected such that the voltage swing of the output was substantially symmetrical about the mid-range value of 7.5 volts. Thus, the ratios of the gate widths of the transistors T1 and T2 were 1:2.5 for the level shifter of FIG. 2, 1:4.5 for the level shifter of FIG. 3, 1:1 for the level shifter of FIG.

4 and 1:1.5 for the level shifter of FIG. 5. Where required, the bias voltage at the input Vb was set to ground potential. Simulated transistor performance was similar to that achievable with low-temperature poly-silicon TFT technology.

As illustrated in FIG. 6, the level shifter of FIG. 3 provides a substantial advantage over the known level shifter of FIG. 2 in that a substantially greater voltage shift can be achieved. In the same sense, the level shifter shown in FIG. 4 represents an improvement over that shown in FIG. 3 and the level shifter shown in FIG. 5 provides an improvement over that shown in FIG. 4.

Figure 7:
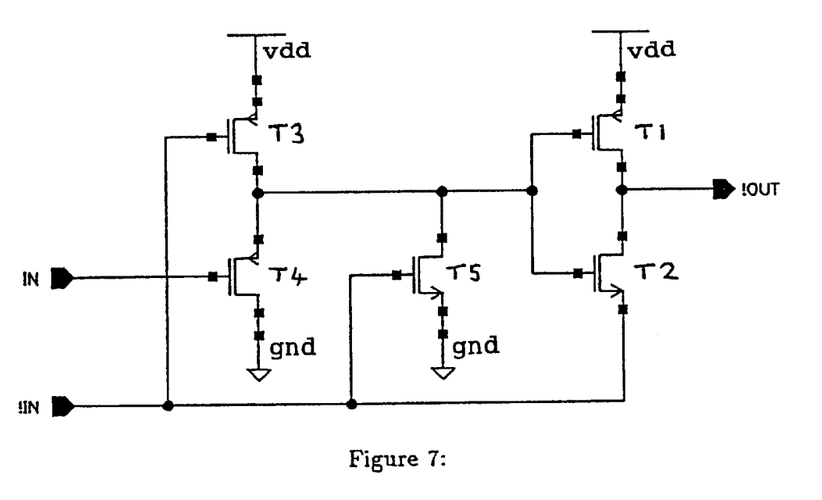
FIG. 7 is a circuit diagram of a level shifter constituting a third embodiment of the invention.

The level shifter shown in FIG. 7 differs from that shown in FIG. 5 in that an N-type transistor T5 has its source, gate and drain connected to ground, the second input I IN and the gates of the first and second transistors T1 and T2, respectively. Because the gate of the transistor T5 receives a relatively low voltage signal, the threshold voltage of the transistor T5 must be sufficiently smaller than this input voltage. For example, when embodied as a poly-silicon TFT, the transistor T5 preferably has a threshold voltage of 2 volts when required to function with an input voltage amplitude of 5 volts. The transistor T5 pulls the input of the inverter formed by the transistors T1 and T2 low when the signal supplied to the input IN is low and that supplied to the input !IN is high. The voltage swing of the circuit node to which the drain of the transistor T5 is connected is therefore improved.

Figure 8:
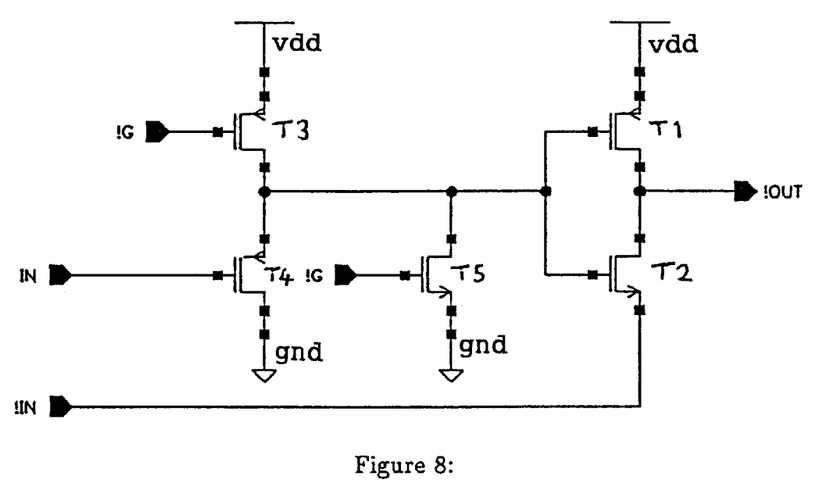
FIG. 8 is a circuit diagram of a level shifter constituting a fourth embodiment of the invention.

The level shifter shown in FIG. 8 differs from that shown in FIG. 7 in that the gates of the transistors T3 and T5 are connected to an inverted gating input !G for receiving an active low gating signal so as to provide gated operation of the level shifter. When the level shifter is required to be active, the inverted gating signal supplied to the input !G is low so that the source follower operates with a bias voltage of 0 volts at the gate of the transistor T3 and the transistor T5 is switched off. When the voltage shifter is required to be inactive, the signal at the input !G goes high. The transistor T3 is turned off and the transistor T5 connects the input of the inverter formed by the transistors T1 and T2 to ground so that the output of the level shifter defaults to a logic high level.

Figure 9:
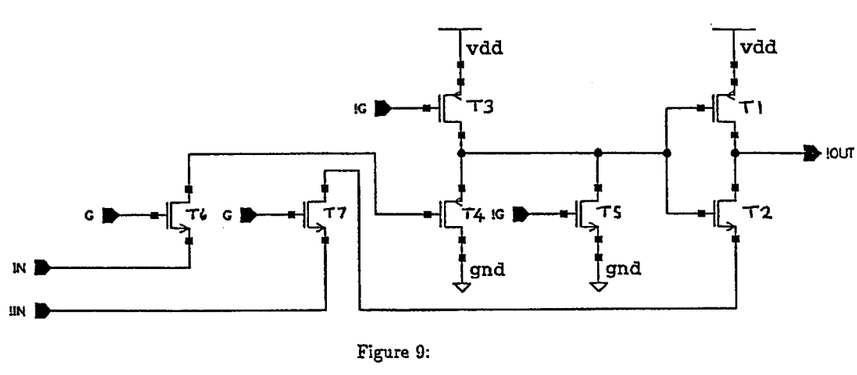
FIG. 9 is a circuit diagram of a level shifter constituting a fifth embodiment of the invention.

The level shifter shown in FIG. 9 differs from that shown in FIG. 8 in that the inputs IN and !IN are connected via the source drain paths of transistors T6 and T7 to the gate of the transistor T4 and the source of the transistor T2, respectively. The gates of the transistors T6 and T7 are connected to a gating input G for receiving an active high gating signal., Thus, when the active high gating signal is at a high level, the transistors T6 and T7 pass the input signals to the gate of the transistor T4 and the source of the transistor T2. When the active high gating signal is low, the inputs IN and !IN are isolated from the other transistors of the level shifter and, in particular, from the gate of the transistor T4. Isolation of the transistor T4 from the input IN is advantageous because it isolates the gate capacitance and therefore reduces the loading on a signal line connected to the input IN. The transistor T7 is optional in that the loading caused by the source of the transistor T2 is relatively low and, for many uses, need not be isolated from a signal line connected to the input !IN.

Figure 10:
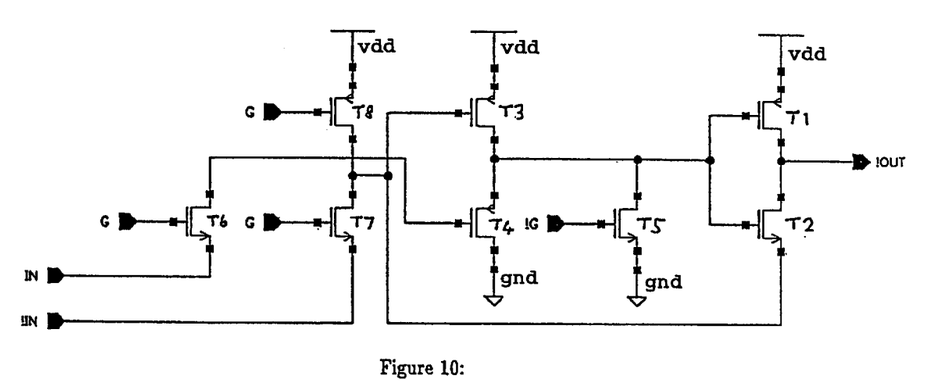
FIG. 10 is a circuit diagram of a level shifter constituting a sixth embodiment of the invention.

The level shifter shown in FIG. 10 is a gated version of that shown in FIG. 4 and comprises the transistors T5 to T7 as shown in FIG. 9. In addition, a pull-up transistor T8 is provided with its drain connected to the gate of the transistor T3 and to the source of the transistor T2, its source connected to the supply line vdd and its gate connected to receive the active high gating signal at the gating input G. The transistor T8 thus ensures that, during inactive periods, the gate of the transistor T3 is pulled high in order to prevent a conduction path between the supply line vdd and ground gnd through the transistors T3 and T5. During the inactive phase, the loads represented by the gate capacitances of the transistors T3 and T4 are disconnected from the inputs IN and !IN by the transistors T6 and T7.

Figure 11:
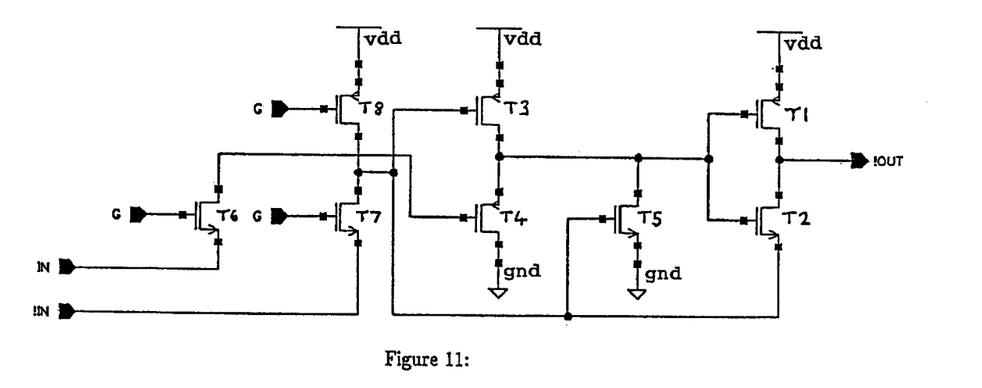
FIG. 11 is a circuit diagram of a level shifter constituting a seventh embodiment of the invention.

The level shifter shown in FIG. 11 differs from that shown in FIG. 10 in that the gate of the transistor T5 is connected to the source of the transistor T2 and the gate of the transistor T3 for receiving the input signal from the input !IN. When the level shifter is active, the transistor T5 contributes to the level shifting as described hereinbefore with reference to FIG. 7. During inactive periods, the gate of the transistor T5 is pulled high by the transistor T8 so as to ensure that the output of the level shifter defaults to the correct logic high state.

An advantage of this arrangement is that gating of the level shifter is controlled by a single active high or positive logic gating signal at the input G. Also, the transistor T6 is optional and may be omitted if the load presented to the signal line connected to the input IN is not critical during the inactive period.

Figure 12:
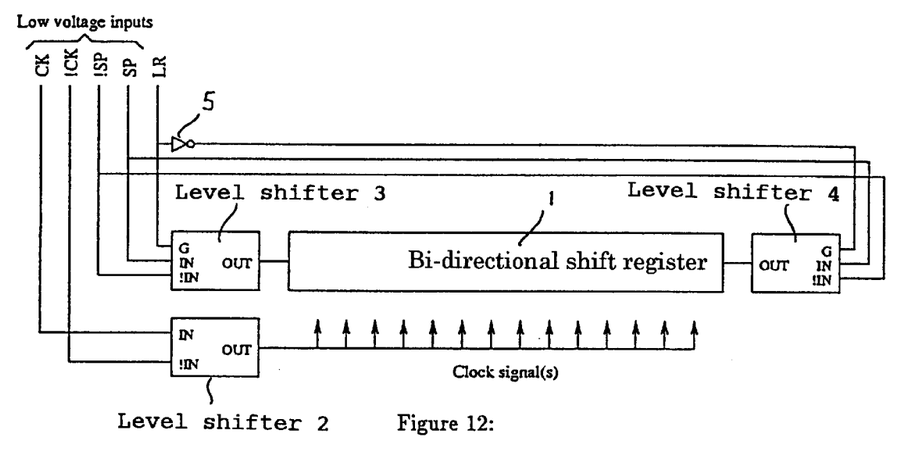
FIG. 12 is a block schematic diagram of drive circuitry for a matrix display using level shifters constituting embodiments of the invention.

FIG. 12 illustrates a possible application of level shifters of the type disclosed herein in the driver circuitry of a matrix display, for example fabricated from poly-silicon TFTs for driving active matrix liquid crystal displays. The driver circuitry comprises a bi-directional shift register 1 which is generally a fundamental component of source and gate line drivers of a matrix display. The shift register 1 operates with a relatively high supply voltage typically greater than or equal to 10 volts, and so requires high voltage input signals in the form of clock and start pulses. However, for compatibility and low power consumption, the panel input voltages are preferably low voltages, for example with amplitudes of 3.3 or 5.0 volts.

The driver circuitry comprises a level shifter 2 of the type shown in FIG. 7 having complementary inputs for receiving complementary clock signals CK and !CK. Thus, the level shifter 2 and associated buffer circuitry supplies one or more high voltage clock signals to the shift register 1 generated from low voltage clock signals CK and !CK.

Level shifters 3 and 4 of the type shown in FIG. 11 are used, with associated buffer circuitry, to supply high voltage start pulses to the shift register 1 generated from complementary low voltage start pulses SP and !SP. A left/right direction control signal LR is supplied to the gating input G of the level shifter 3 and via an inverter 5 to the gating input G of the level shifter 4. Thus, the state of the direction control signal LR determines which of the level shifters 3 and 4 is enabled, which in turn determines to which end of the bi-directional shift register 1 a start pulse is supplied.

What is claimed is:
1. A voltage level shifter comprising: a first input for receiving a direct input signal; a second input for receiving an inverted input signal; an output for producing an inverted output signal which is inverted and level-shifted relative to the direct input signal; a voltage follower whose input is connected to the first input; and an output circuit comprising a first transistor of a first conduction type whose output electrode is connected to the output and whose control electrode is connected to an output of the voltage follower, and a second transistor of a second conduction type different from the first type whose output electrode is connected to the output, whose control electrode is connected to the output of the voltage follower, and whose common electrode is connected to the second input.

2. A shifter as claimed in claim 1, in which the voltage follower comprises third and fourth transistors of the first conduction type whose main conduction paths are connected in series between first and second power supply inputs, the control electrode of the fourth transistor being connected to the first input and the control electrodes of the first and second transistors being connected to the output electrode of the third transistor and to the common electrode of the fourth transistor.

3. A shifter as claimed in claim 2, in which the common electrode of the first transistor is connected to the first power supply input.

4. A shifter as claimed in claim 2, in which the control electrode of the third transistor is connected to a bias voltage input.

5. A shifter as claimed in claim 2, in which the control electrode of the third transistor is connected to the second power supply Input.

6. A shifter as claimed in claim 2, In which the control electrode of the third transistor is connected to the second input.

7. A shifter as claimed in claim 3, in which the control electrodes of the first and second transistors are connected to the output electrode of a fifth transistor of the second conduction type whose common electrode is connected to the second power supply input and whose control electrode is connected to the second input.

8. A shifter as claimed in claim 4, in which the control electrodes of the first and second transistors are connected to the output electrode of a fifth transistor of the second conduction type whose common electrode is connected to the second power supply input and whose control electrode is connected to the second input.

9. A shifter as claimed in claim 5, in which the control electrodes of the first and second transistors are connected to the output electrode of a fifth transistor of the second conduction type whose common electrode is connected to the second power supply input and whose control electrode is connected to the second input.

10. A shifter as claimed in claim 6, in which the control electrodes of the first and second transistors are connected to the output electrode of a fifth transistor of the second conduction type whose common electrode is connected to the second power supply input and whose control electrode is connected to the second input.

11. A shifter as claimed in claim 2, in which the control electrodes of the first and second transistors are connected to the output electrode of a fifth transistor of the second conduction type whose common electrode is connected to the second power supply input, the control electrodes of the third and fifth transistors being connected to an active low gating input.

12. A shifter as claimed in claim 1, in which the voltage follower input is connected to the first input via the main conduction path of a sixth transistor of the second conduction type whose control electrode is connected to an active high gating input.

13. A shifter as claimed in claim 1, in which the common electrode of the second transistor is connected to the second input via the main conduction path of a seventh transistor of the second conduction type whose control electrode is connected to the active high gating input.

14. A shifter as claimed in claim 12, in which the common electrode of the second transistor and the control electrode of the third transistor are connected to the output of an eighth transistor of the first conduction type whose control electrode is connected to the active high gating input.

15. A shifter as claimed in claim 13, in which the common electrode of the second transistor and the control electrode of the third transistor are connected to the output of an eighth transistor of the first conduction type whose control electrode is connected to the active high gating input.

16. A shifter as claimed in claim 1, in which each of the transistors comprises a field effect transistor and the output, control and common electrodes comprise drain, gate and source electrodes, respectively.

17. A shifter as claimed in claim 14, in which each of the transistors comprises an amorphous silicon thin film transistor.

18. A shifter as claimed in claim 15, in which each of the transistors comprises an amorphous silicon thin film transistor.

19. A shifter as claimed in claim 14, in which each of the transistors comprises a poly-silicon thin film transistor.

20. A shifter as claimed in claim 15, in which each of the transistors comprises a poly-silicon thin film transistor.

21. A shifter as claimed in claim 16, comprising at least part of a CMOS integrated circuit.

22. A shifter as claimed in claim 17, comprising at least part of a CMOS integrated circuit.

23. A shifter as claimed in claim 18, comprising at least part of a CMOS integrated circuit.

24. A shifter as claimed in claim 19, comprising at least part of a CMOS integrated circuit.

25. A shifter as claimed in claim 20, comprising at least part of a CMOS integrated circuit.

26. A poly-silicon display comprising:
an integrated driver including at least one shifter, each of the at least one shifter comprising:
a first input for receiving a direct input signal; a second input for receiving an inverted input signal;
an output for producing an inverted output signal which is inverted and level shifted relative to the direct input signal;
a voltage follower including a third transistor, whose input is connected to the first input;
an output circuit comprising a first transistor of a first conduction type whose output electrode is connected to the output and whose control electrode in connected to an output of the voltage follower, and a second transistor of a second conduction type different from the first type whose output electrode is connected to the output, whose control electrode is connected to the output of the voltage follower, and whose common electrode is connected to the second input;
wherein the voltage follower input is connected to the first input via the main conduction path of a sixth transistor of the second conduction type whose control electrode is connected to an active high gating input;
wherein the common electrode of the second transistor and the control electrode of the third transistor are connected to the second input via the main conduction path of an eighth transistor of the first conduction type whose control electrode is connected to the active high gating input, and
wherein each of the transistors comprises a poly-silicon thin film transistor.

27. A poly-silicon display comprising:
an integrated driver including at least one shifter, each of the at least one shifter comprising:

a first input for receiving a direct input signal; a second input for receiving an inverted input signal;

an output for producing an inverted output signal which is inverted and level shifted relative to the direct input signal;

a voltage follower, including a third transistor, whose input is connected to the first input;

an output circuit comprising a first transistor of a first conduction type whose output electrode is connected to the output and whose control electrode is connected to an output of the voltage follower, and a second transistor of a second conduction type different from the first type whose output electrode is connected to the output, whose control electrode is connected to the output of the voltage follower, and whose common electrode is connected to the second input;

wherein the common electrode of the second transistor is connected to the second input via the main conduction path of a seventh transistor of the second conduction type whose control electrode is connected to the active high gating input;

wherein the common electrode of the second transistor and the control electrode of the third transistor are connected to the second input via the main conduction path of an eighth transistor of the first conduction type whose control electrode is connected to the active high gating input; and wherein each of the transistors comprises a poly-silicon thin film transistor.

28. A poly-silicon display comprising:

an integrated driver including a shift register and at least one shifter, each of the at least one shifter comprising:

a first input for receiving a direct input signal; a second input for receiving an inverted input signal;

an output for producing an inverted output signal which is inverted and level shifted relative to the direct input signal;

a voltage follower, including a third transistor, whose input is connected to the first input;

an output circuit comprising a first transistor of a first conduction type whose output electrode is connected to the output and whose control electrode is connected to an output of the voltage follower, and a second transistor of a second conduction type different from the first type whose output electrode is connected to the output, whose control electrode is connected to the output of the voltage follower, and whose common electrode is connected to the second input;

wherein the voltage follower input is connected to the first input via the main conduction path of a sixth transistor of the second conduction type whose control electrode is connected to an active high gating input;

wherein the common electrode of the second transistor and the control electrode of the third transistor are connected to the second input via the main conduction path of an eighth transistor of the first conduction type whose control electrode is connected to the active high gating input; and wherein each of the transistors comprises a poly-silicon thin film transistor.

29. A poly-silicon display comprising:

an integrated driver including a shift register and at least one shifter, each of the at least one shifter comprising:

a first input for receiving a direct input signal; a second input for receiving an inverted input signal;

an output for producing an inverted output signal which is inverted and level shifted relative to the direct input signal;

a voltage follower, including a third transistor, whose input is connected to the first input;

an output circuit comprising a first transistor of a first conduction type whose output electrode is connected to the output and whose control electrode is connected to an output of the voltage follower, and a second transistor of a second conduction type different from the first type whose output electrode is connected to the output, whose control electrode is connected to the output of the voltage follower, and whose common electrode is connected to the second input;

wherein the common electrode of the second transistor is connected to the second input via the main conduction path of a seventh transistor of the second conduction type whose control electrode is connected to the active high gating input;

wherein the common electrode of the second transistor and the control electrode of the third transistor are connected to the second input via the main conduction path of an eighth transistor of the first conduction type whose control electrode is connected to the active high gating input; and wherein each of the transistors comprises a poly-silicon thin film transistor.

* * * * *